(12) United States Patent
Uberti et al.

(10) Patent No.: US 12,244,277 B2
(45) Date of Patent: Mar. 4, 2025

(54) COMMON MODE TRANSIENT SUPPRESSION

(71) Applicant: Allegro MicroSystems, LLC, Manchester, NH (US)

(72) Inventors: Bruno Luis Uberti, Ciudad Autonoma de Buenos Aires (AR); Juan Guido Salaya Velazquez, Ciudad Autonoma de Buenos Aires (AR); Alejandro Gabriel Milesi, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 501 days.

(21) Appl. No.: 17/653,487

(22) Filed: Mar. 4, 2022

(65) Prior Publication Data

US 2023/0283250 A1    Sep. 7, 2023

(51) Int. Cl.
*H03F 3/45*      (2006.01)
*H03F 3/21*      (2006.01)

(52) U.S. Cl.
CPC ......... *H03F 3/45071* (2013.01); *H03F 3/211* (2013.01); *H03F 2200/432* (2013.01)

(58) Field of Classification Search
CPC .............. H03F 3/45071; H03F 3/211; H03F 2200/432; H03F 2203/45431; H03F 2203/45544; H03F 3/45188; H03F 3/45704; H03F 3/347; H03F 2200/271
USPC .................................................. 330/252–261
See application file for complete search history.

(56) References Cited

U.S. PATENT DOCUMENTS

| | | | |
|---|---|---|---|
| 4,748,419 A | 5/1988 | Somerville | |
| 7,732,889 B2 | 6/2010 | Crawley et al. | |
| 8,786,279 B2 | 7/2014 | Petrie | |
| 9,473,163 B1 | 10/2016 | Tsai | |
| 9,514,788 B1 | 12/2016 | Kim | |
| 10,236,878 B1 * | 3/2019 | Chen ..................... | H02M 3/158 |
| 10,659,173 B1 | 5/2020 | Li et al. | |
| 10,985,720 B2 | 4/2021 | Drinovsky et al. | |
| 11,029,366 B2 | 6/2021 | Briano | |
| 11,201,619 B2 | 12/2021 | Rinne et al. | |
| 11,228,466 B2 | 1/2022 | Petrie et al. | |

(Continued)

OTHER PUBLICATIONS

U.S. Appl. No. 18/192,932, filed Mar. 30, 2023, Horan et al.

(Continued)

*Primary Examiner* — Hieu P Nguyen
(74) *Attorney, Agent, or Firm* — DALY, CROWLEY, MOFFORD & DURKEE, LLP

(57) ABSTRACT

Methods and apparatus for a signal isolator that mitigates the effects of CMTI strikes. In embodiments, a first die comprises a transmit module and the first die has a first voltage domain; and a second die comprises a receive module including a receive amplifier configured to receive from the transmit module a transmit signal that includes a differential signal and a common mode current. The second die may have a second voltage domain with the first and second die being separated by an isolation barrier. In embodiment, the receive amplifier includes a differential amplifier to receive the differential input signal from the transmit module; and a common mode module configured to sense the common mode current and sink or source the common mode current and minimize changes to an input impedance of the receive amplifier.

15 Claims, 8 Drawing Sheets

(56) References Cited

U.S. PATENT DOCUMENTS

| | | |
|---|---|---|
| 11,272,591 B1 | 3/2022 | Lee |
| 11,289,406 B2 | 3/2022 | Briano et al. |
| 11,515,246 B2 | 11/2022 | Chetlur et al. |
| 2018/0131341 A1 | 5/2018 | Nallamothu |
| 2020/0014463 A1 | 1/2020 | Tanaka |
| 2021/0057330 A1 | 2/2021 | Briano et al. |
| 2023/0084169 A1 | 3/2023 | Chetlur et al. |

OTHER PUBLICATIONS

Daughton, "Spin-Dependent Sensors;" Invited Paper; Proceedings of the IEEE, vol. 91, No. 5; May 2003; 6 Pages.

Kanekawa, et al.; "An Analog Front-End LSI with On-Chip Isolator for V.90 56kbps Modems"; 2000 Custom Integrated Circuits Conference; pp. 327-330; May 2000; 4 Pages.

U.S. Non-Final Office Action dated Jun. 3, 2021 for U.S. Appl. No. 16/526,081; 14 Pages.

Response to U.S. Non-Final Office Action dated Jun. 3, 2021 for U.S. Appl. No. 16/526,081; Response filed Jun. 21, 2021; 15 Pages.

U.S. Final Office Action dated Sep. 29, 2021 for U.S. Appl. No. 16/526,081; 15 Pages.

U.S. Appl. No. 16/365,855, filed Mar. 27, 2019, Daubert, et al.

U.S. Appl. No. 16/511,104, filed Jul. 15, 2019, Petrie et al.

Response to U.S. Final Office Action dated Sep. 29, 2021 for U.S. Appl. No. 16/526,081; Response filed Oct. 28, 2021; 14 Pages.

U.S. Notice of Allowance dated Nov. 29, 2021 for U.S. Appl. No. 16/526,081; 11 Pages.

PCT International Search Report and Written Opinion dated May 16, 2023 for International Application No. PCT/US2023/061711; 13 Pages.

* cited by examiner

COMMON MODE TRANSIENT SUPPRESSION

BACKGROUND

As is known in the art, common mode transient signals can interfere with circuit operation. For example, a common mode transient can swamp the dynamic range for a given differential input signal. In signal isolator applications, a common mode transient may be an order of magnitude greater than a differential signal input.

SUMMARY

Embodiments of the disclosure provide methods and apparatus for a common mode transient processing circuit that may suppress, buffer or otherwise mitigate the effects of common mode current signals. Example common mode transient suppression circuits may be useful in digital-isolator parts, as well as a variety of other applications where multi-ground domains are required. In general, embodiments of a common mode transient suppression circuit provide a closed-loop circuit topology that suppress/cancels out input current transients during CMTI perturbations. In some embodiments, the common mode transient suppression circuit includes a closed-loop class AB high bandwidth buffer that is able to sink and source the fast transient current injected at the input of a receiver during CMTI perturbation.

In example embodiments, common mode transient suppression circuits can separate the common mode and differential impedances to allow independent design of the differential and common mode paths which allows allocation of the maximum differential dynamic range to the signal of interest even in presence of a much larger common mode signal amplitudes. It is understood to those skilled in the art that large common mode signals may undesirably require all of the available dynamic range to process just the common mode signal. In addition, this may not be possible in purely passive filtering approach.

With active common mode transient suppression, power efficiency and scalability are provided that also enables higher common mode transient immunity operation. By separating the differential and common mode impedances, the maximum available input dynamic range can be used for the differential path and little or no dynamic range allocated for processing the common mode signal. It will be appreciated that this is a significant advantage over conventional purely passive filtering approaches in which the common mode and differential paths share the same impedance.

Common Mode Transient Immunity (CMTI) is useful to specify the level of immunity in a multi-ground GND domain application to a fast transient perturbation in one domain in reference to the other. Transient perturbations are typically measured in KV/us or V/ns.

CMTI designs may trade off headroom, bandwidth, and/or gain to set limits in circuit implementations. CMTI provides a measure of the robustness of the system to common mode strikes between the different GND domains. Usually, isolated domains require a degree of robustness to transients that only occur in one of the domains. The electrical isolation will depend on the level of impedance coupling between different boundaries at different frequencies. This is highly correlated to the technology involved in the isolation barrier. In the case of capacitive isolators, the same isolation barrier is shared for the signal path as well the common mode coupling path, which presents certain challenges for CMTI design robustness.

In one aspect, a signal isolator comprises: a first die comprising a transmit module, wherein the first die has a first voltage domain; and a second die comprising a receive module including a receive amplifier configured to receive from the transmit module a transmit signal that includes a differential signal and a common mode current, wherein the second die has a second voltage domain, wherein the first and second die are separated by an isolation barrier, and wherein the receive amplifier comprises: a differential amplifier to receive the differential input signal from the transmit module; and a common mode module configured to sense the common mode current and sink or source the common mode current and minimize changes to an input impedance of the receive amplifier.

A signal isolator can further include one or more of the following features: the first and second die have a capacitively coupled signal connection to carry the transmit signal, the common mode module comprises a class AB amplifier, the common mode module is configured to control a regulated input common mode voltage so that a dynamic range of the differential amplifier is used for the differential input signal, the common mode module is configured to control a regulated input common mode voltage so that a dynamic range of the differential amplifier is not used for the common mode current, and/or the receive module is configured to separate a differential impedance and a common mode impedance.

In another aspect, a method comprises: employing, in a signal isolator, a first die comprising a transmit module, wherein the first die has a first voltage domain; and employing a second die comprising a receive module including a receive amplifier configured to receive from the transmit module a transmit signal that includes a differential signal and a common mode current, wherein the second die has a second voltage domain, wherein the first and second die are separated by an isolation barrier, and wherein the receive amplifier comprises: a differential amplifier to receive the differential input signal from the transmit module; and a common mode module configured to sense the common mode current and sink or source the common mode current and minimize changes to an input impedance of the receive amplifier.

A method can further include one or more of the following features: the first and second die have a capacitively coupled signal connection to carry the transmit signal, the common mode module comprises a class AB amplifier, the common mode module is configured to control a regulated input common mode voltage so that a dynamic range of the differential amplifier is used for the differential input signal, the common mode module is configured to control a regulated input common mode voltage so that a dynamic range of the differential amplifier is not used for the common mode current, and/or the receive module is configured to separate a differential impedance and a common mode impedance.

In a further aspect, a signal isolator comprises: a first die means for providing a transmit module and a first voltage domain; and a second die means for providing a receive module including a receive amplifier configured to receive from the transmit module a transmit signal that includes a differential signal and a common mode current, wherein the second die has a second voltage domain, wherein the first and second die are separated by an isolation barrier, and wherein the receive amplifier comprises: a differential amplifier means for receiving the differential input signal from the transmit module; and a common mode means for sensing the common mode current and sink or source the common mode current and minimizing changes to an input impedance of the receive amplifier.

A signal isolator can further include one or more of the following features: the first and second die means have a capacitively coupled signal connection to carry the transmit signal, the common mode means comprises a class AB amplifier, the common mode means is configured to control a regulated input common mode voltage so that a dynamic range of the differential amplifier is used for the differential input signal, the common mode means is configured for controlling a regulated input common mode voltage so that a dynamic range of the differential amplifier is not used for the common mode current, and/or the receive means is configured for separating a differential impedance and a common mode impedance.

BRIEF DESCRIPTION OF THE DRAWINGS

The foregoing features of this disclosure, as well as the disclosure itself, may be more fully understood from the following description of the drawings in which.

DETAILED DESCRIPTION

Figure 1:
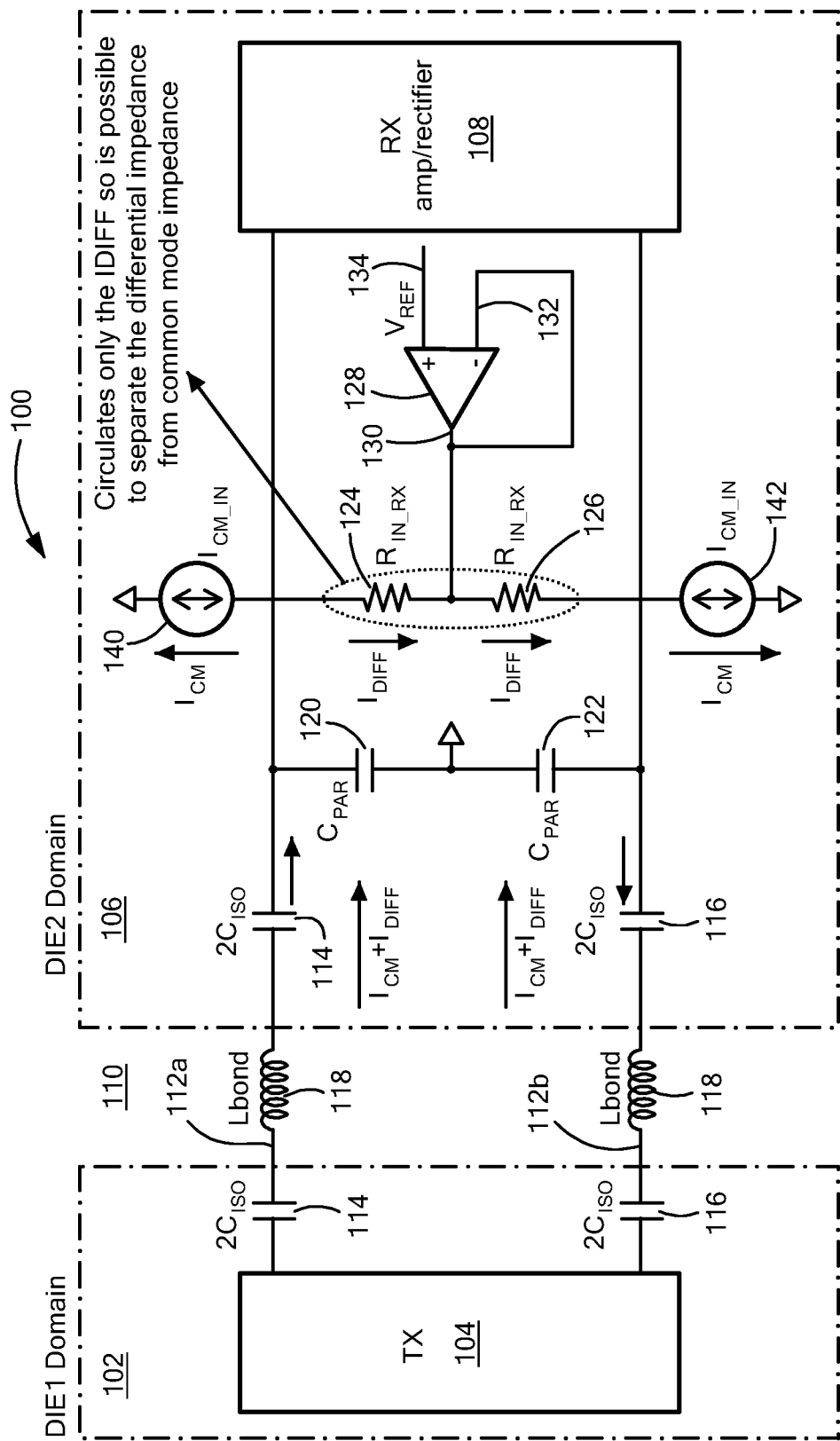
FIG. 1 is a schematic representation of a signal isolator having common mode transient processing in accordance with example embodiments of the disclosure.

FIG. 1 shows an example system 100 having active common mode transient signal suppression in accordance with example embodiments of the disclosure. In the illustrated embodiment, a first die 102, which includes a transmitter module 104, is connected to a second die 106 in a signal isolator application where the second die 106 includes a receiver module 108. The first die 102 may have a different voltage domain than the second die 106 and the die may be separated by an isolation region 110 that includes a dielectric material.

In the illustrated embodiment, the first and second die 102, 106 are connected to each other via differential signal connections 112a,b. The respective connections 112 can include isolation capacitors 114, 116 in the respective first and second die 102, 106 and an inherent inductance 118 of the bond wire connection through the isolation region 110.

It is understood that the first and second die can be formed from a single die or from discrete die. In general, the first and second die are electrically isolated from each other.

The second die 106 can include first and second capacitors 120, 122 coupled end-to-end across the differential signals 112a,b and first and second resistors 124, 126 also coupled end-to-end across the differential signals 112a,b. An amplifier 128 is coupled in a feedback configuration with an output 130 coupled to a node between the first and second resistors 124, 126 and to a first input 132 of the amplifier. A reference voltage is coupled to the other input 134 of the amplifier 128. In some embodiments, a transimpedance amplifier (TIA) may be used.

A first transient suppression module 140 is coupled to the first differential input signal 112a and a second transient suppression module 142 is coupled to the second differential signal 112b. Each of the input signals 112a,b contain common mode current $I_{CM}$, which is undesirable, and differential input current $I_{DIFF}$, which is the signal of interest. As described more fully below, the first and second transient suppression modules 140, 142 extract (source or sink) the common mode current $I_{CM}$ from the input differential signals 112a,b. The differential current $I_{CM}$ is then presented to the receiver module 108 with the common mode current $I_{CM}$ removed. The differential impedance is separated from the common mode impedance.

The CMTI specification for a capacitive coupled isolator defines a current being injected from one GND domain (DIE1 domain) to another GND domain (DIE2 domain). This common mode current and in addition to the input differential current, defines the input current dynamic range of the circuit required for proper operation. In a signal isolator, the common mode current is often larger than the input differential current.

CMTI strikes could be classified in static and dynamic depending on the testing conditions. A static CMTI refers to a case when the inputs are tied to logic high or logic low states while outputs are monitored during the CMTI strike, and a dynamic CMTI condition refers to a case when the CMTI strike happens while input data is toggling and the outputs are being monitored to be fault free (missing pulses, extra pulses, too much delay, etc.)

Figure 2A:
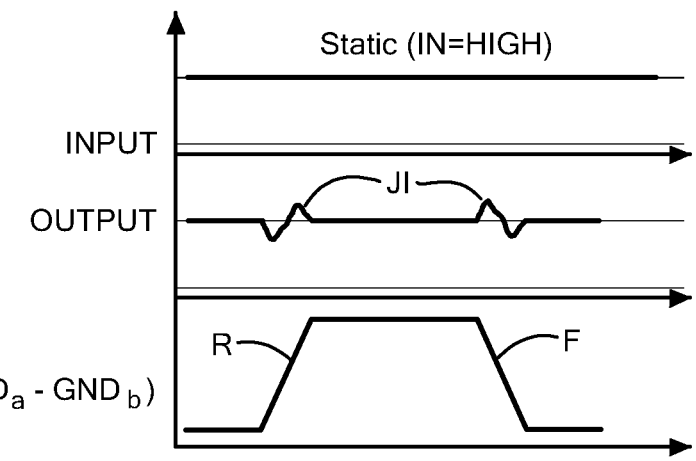
FIG. 2A shows an example waveform for a static CMTI strike wherein the input is HIGH.
Figure 2B:
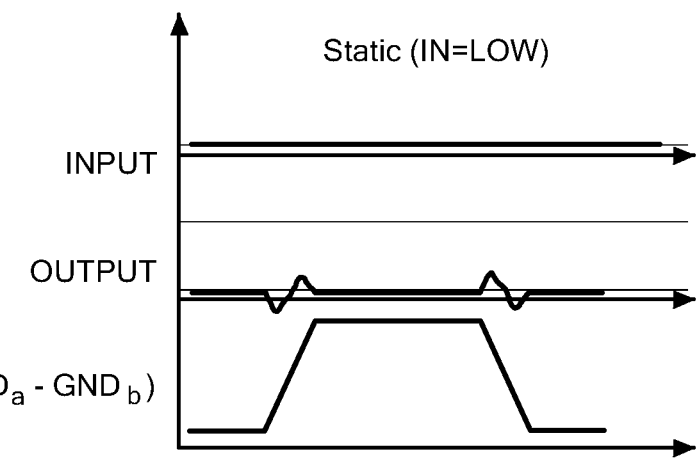
FIG. 2B shows an example waveform for a static CMTI strike wherein the input is LO.
Figure 2C:
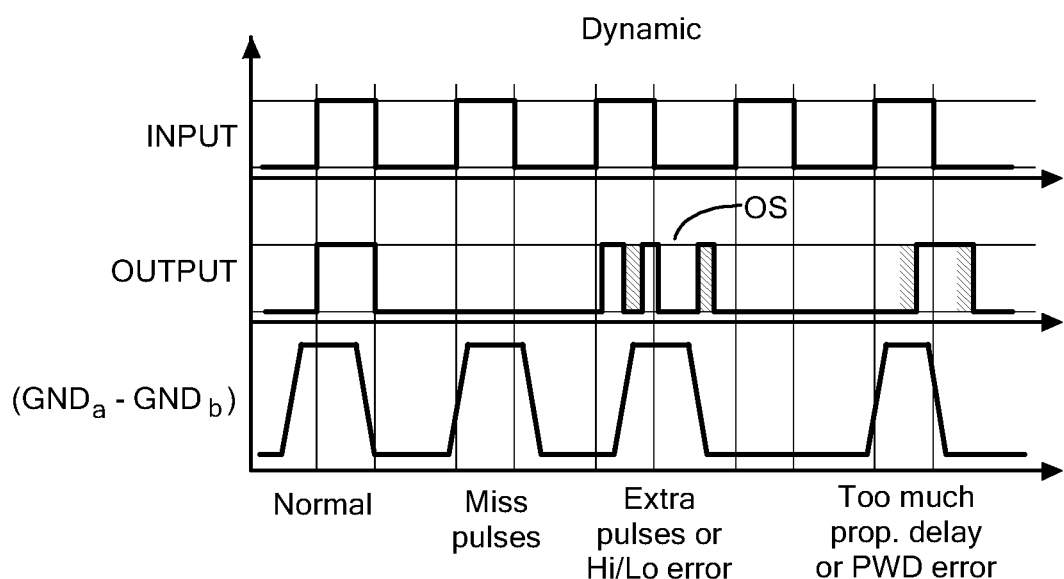
FIG. 2C shows an example waveform for a dynamic CMTI strike when input data is toggling.

FIG. 2A shows a static CMTI strike with an input signal in a HIGH state. There is some noise JI in the output signal at the rising and falling edges R,F of the ground differential signal (GNDa−GNDb). FIG. 2B shows a similar CMTI strike with an input signal in a LOW state. FIG. 2C shows a series of pulses on an input signal some of which are not present in the output signal, which may also contain some oscillation and/or unknown states OS. The ground differential signal (GNDa−GNDb) shows a normal pulse, missed pulse, extra pulses or error, and excessive propagation delay or pulse width delay error.

Figure 3:
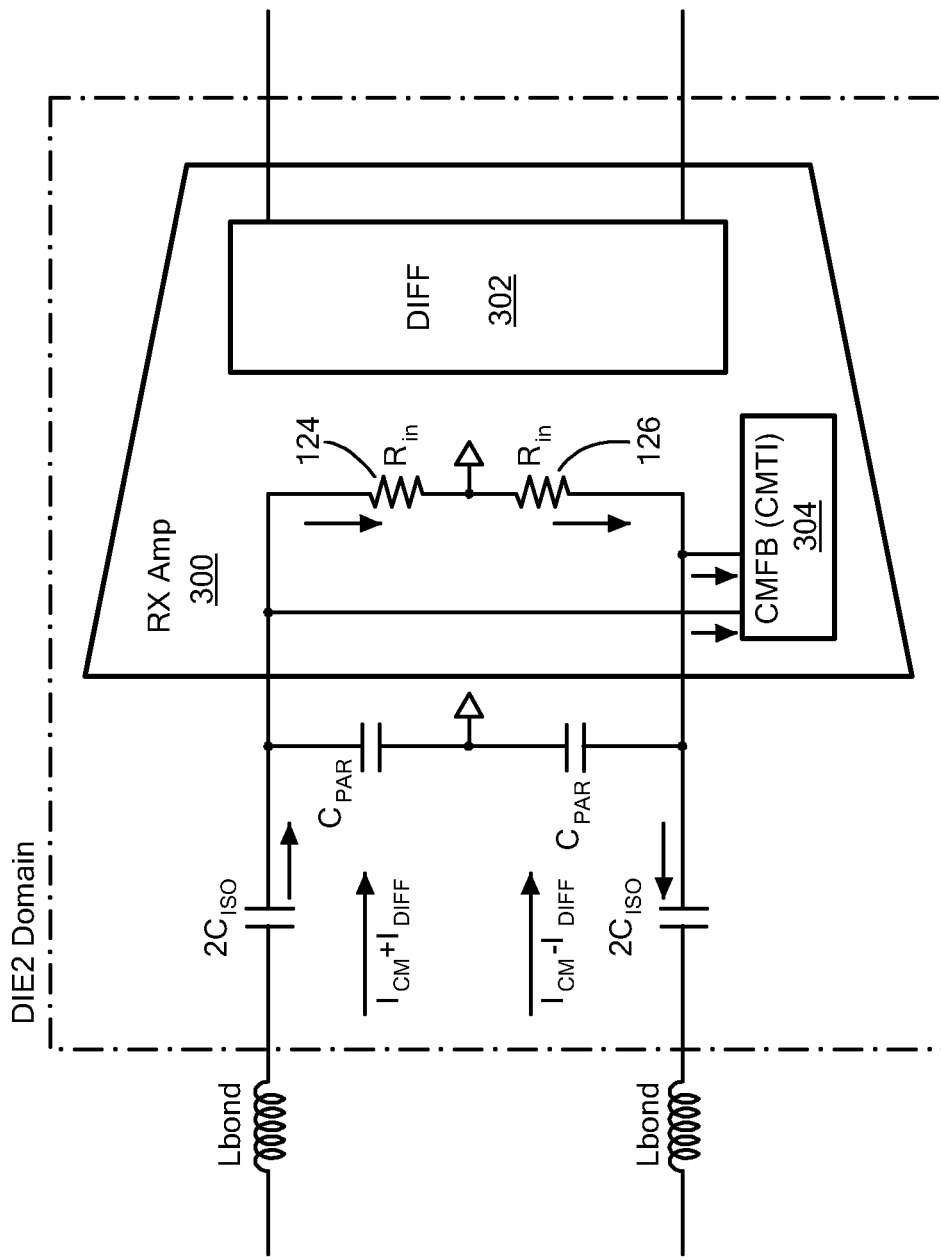
FIG. 3 shows an example schematic representation of an example receive amplifier having a differential amplifier and a common mode signal processing module.

FIG. 3 shows further detail of the circuit of FIG. 1 including a receive amplifier 300 having a differential amplifier 302 with the first and second transient suppression modules 140, 142 of FIG. 1 shown as a single CMTI module 304. The CMTI buffer or suppressor circuit 304 provides common mode feedback (CMFB) or CMTI buffering. The CMTI module 304 provides a low impedance to the common mode injected current $I_{CM}$ without affecting the input impedance of the receive amplifier 300.

The CMTI buffer or suppressor 304 senses the input signals common mode and sinks or sources that current in common mode way so as to avoid affecting the differential input impedance and signal. Then the differential amplifier 302 amplifies the input signal seen across the resistors 124, 126.

Figure 3A:
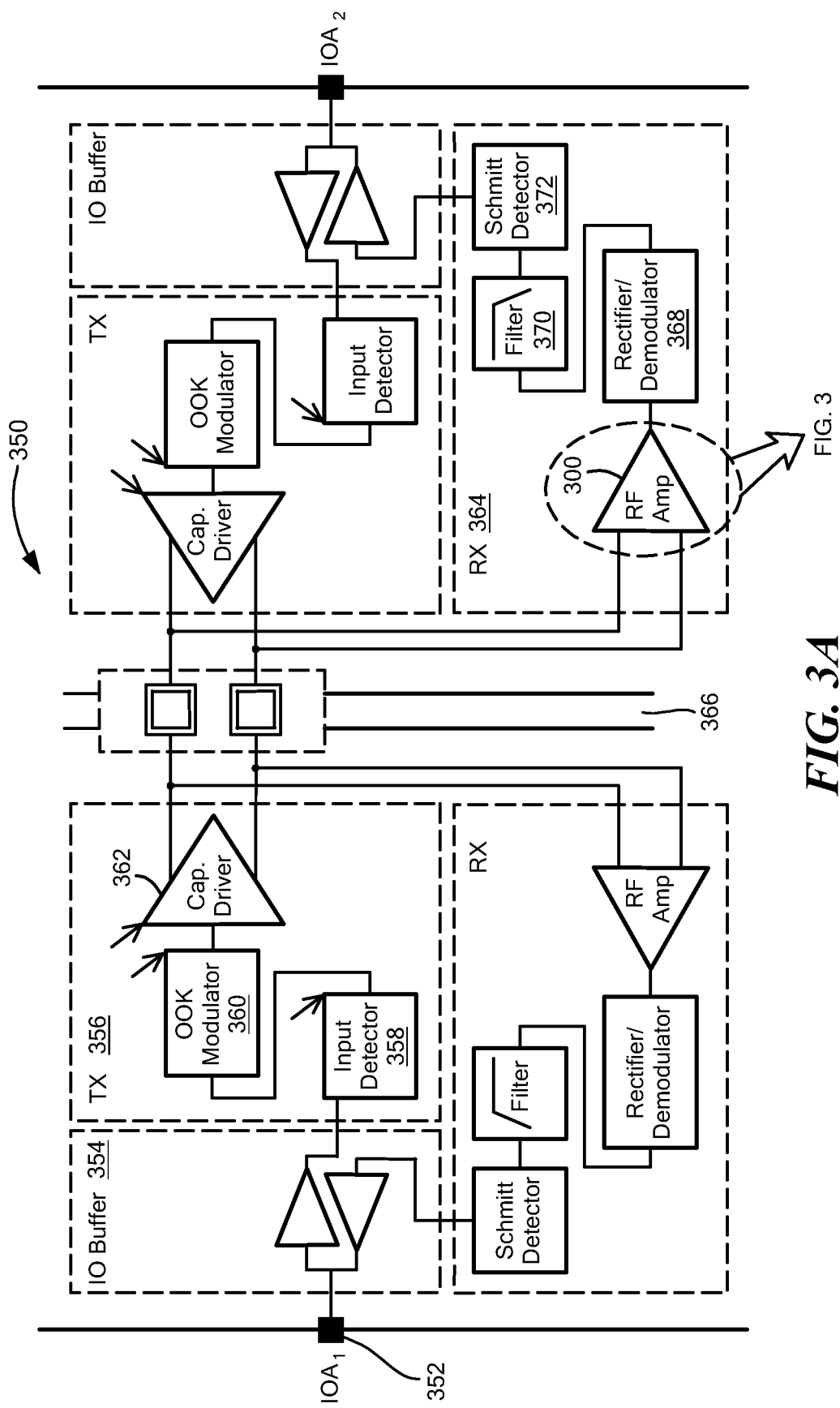
FIG. 3A shows a block diagram of a portion of a signal isolator channel, including a receive amplifier having a differential amplifier and a common mode signal processing module.

FIG. 3A shows a portion of an example bi-directional isolator 350 for which the receive amplifier 300 of FIG. 3 forms a part. A receive path includes an IO terminal 352 to receive an input (or output) signal at an IO buffer 354 for a transmit module 356 having an input detector 358, a modulator 360, and a driver module 362. The receive amplifier 300 of a receive module 364 receives the input from the transmit module 356 across the barrier 366. The output of the receive amplifier 300 can be rectified/demodulated 368, filtered 370, and detected 372.

Figure 4:
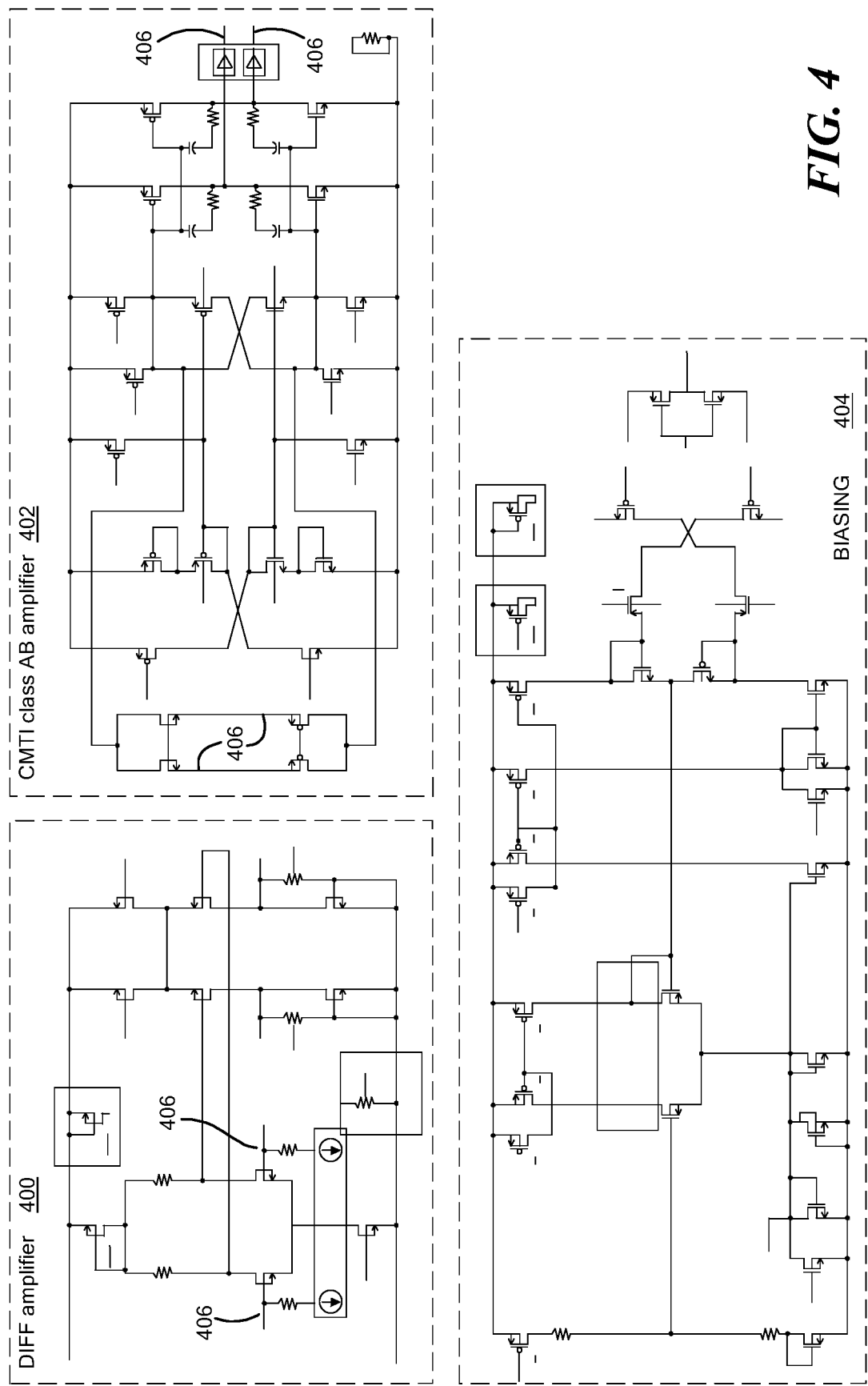
FIG. 4 is a circuit diagram of an example receive amplifier having a differential amplifier, a common mode signal processing amplifier, and a biasing circuit.

FIG. 4 shows an example implementation of a differential amplifier 400, such as the differential amplifier 302 of FIG. 3, an example implementation of a transient/buffer module 402, such as the CMTI module 304, as a class AB amplifier, and an example biasing circuit 404. The amplifier 402 senses the common mode input signals 406 across the resistors and sinks or sources the common mode current to avoid affecting the differential input impedance and signal.

Figure 5:
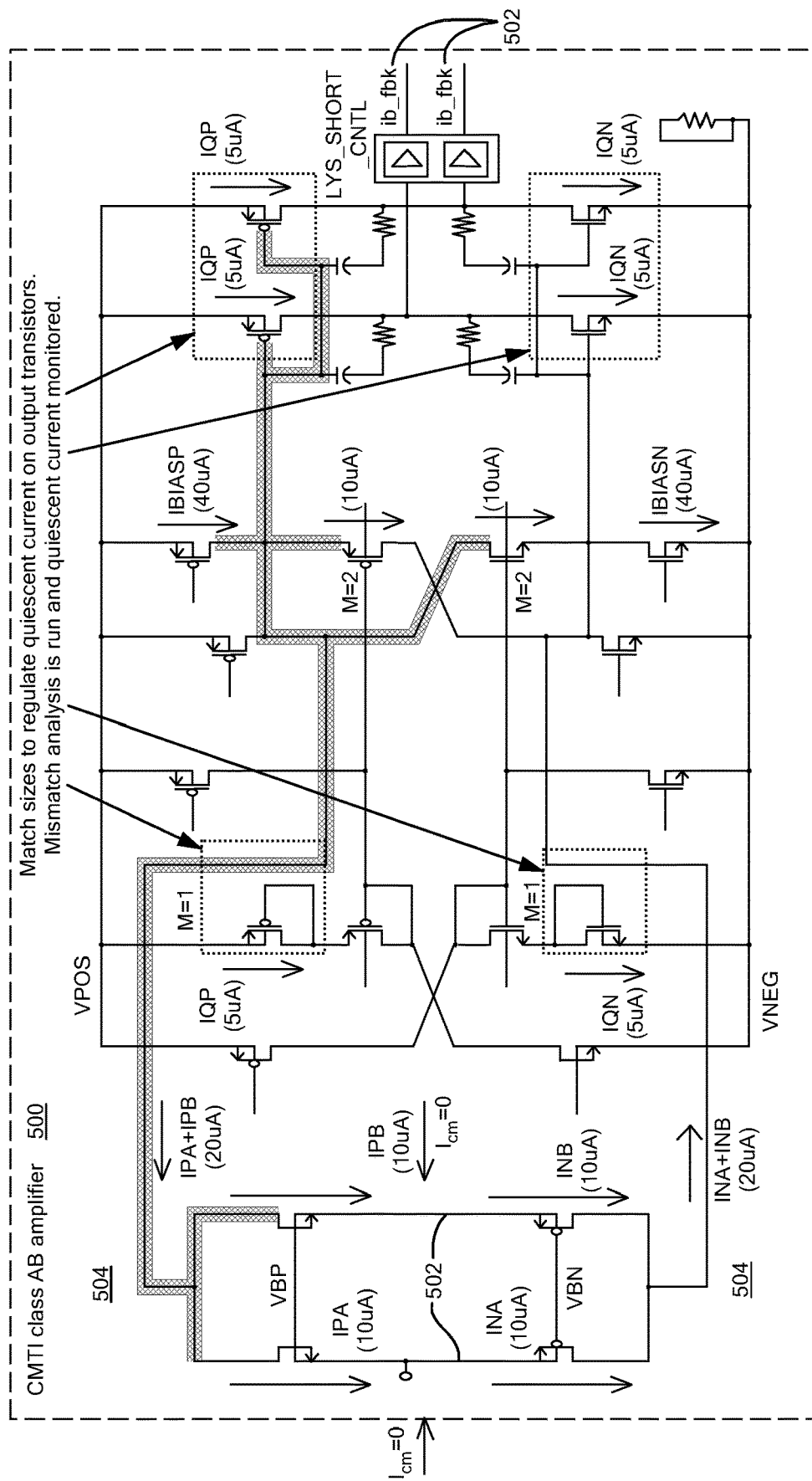
FIG. 5 is a circuit diagram of an example class AB common mode signal processing amplifier when a CMTI strike is not present.

FIG. 5 shows operation of an example class AB amplifier 500 during no common mode current shown as $I_{CM}=0$. In the illustrated embodiment, the CMTI suppressor circuit is a fully differential rail-to-rail implementation of a common gate input stage that senses the input voltage through the common mode input pair and injects or subtracts the required input current in a common mode way to maintain the input common-mode voltage stage at the desired level. This allows the buffer to control the input common-mode voltage regulated and extend the input dynamic range to the differential signal only.

When the common mode current injected is zero, i.e., no CMTI strike $I_{CM}=0$, the input nodes 502 tend to remain at the selected input common-mode voltage. The currents 504 are balanced so that the output class AB driver only consumes the quiescent current for which it was designed. As can be seen, current mirrors can be used as desired to meet the needs of a particular application.

In the example embodiment, for a bias current, shown as IBIASP and IBIASN of 40 µA, the amplifier current (IPA+IPB) is 20 µA when $I_{CM}=0$ is balanced so that the currents are equal at 10 µA.

Figure 6:
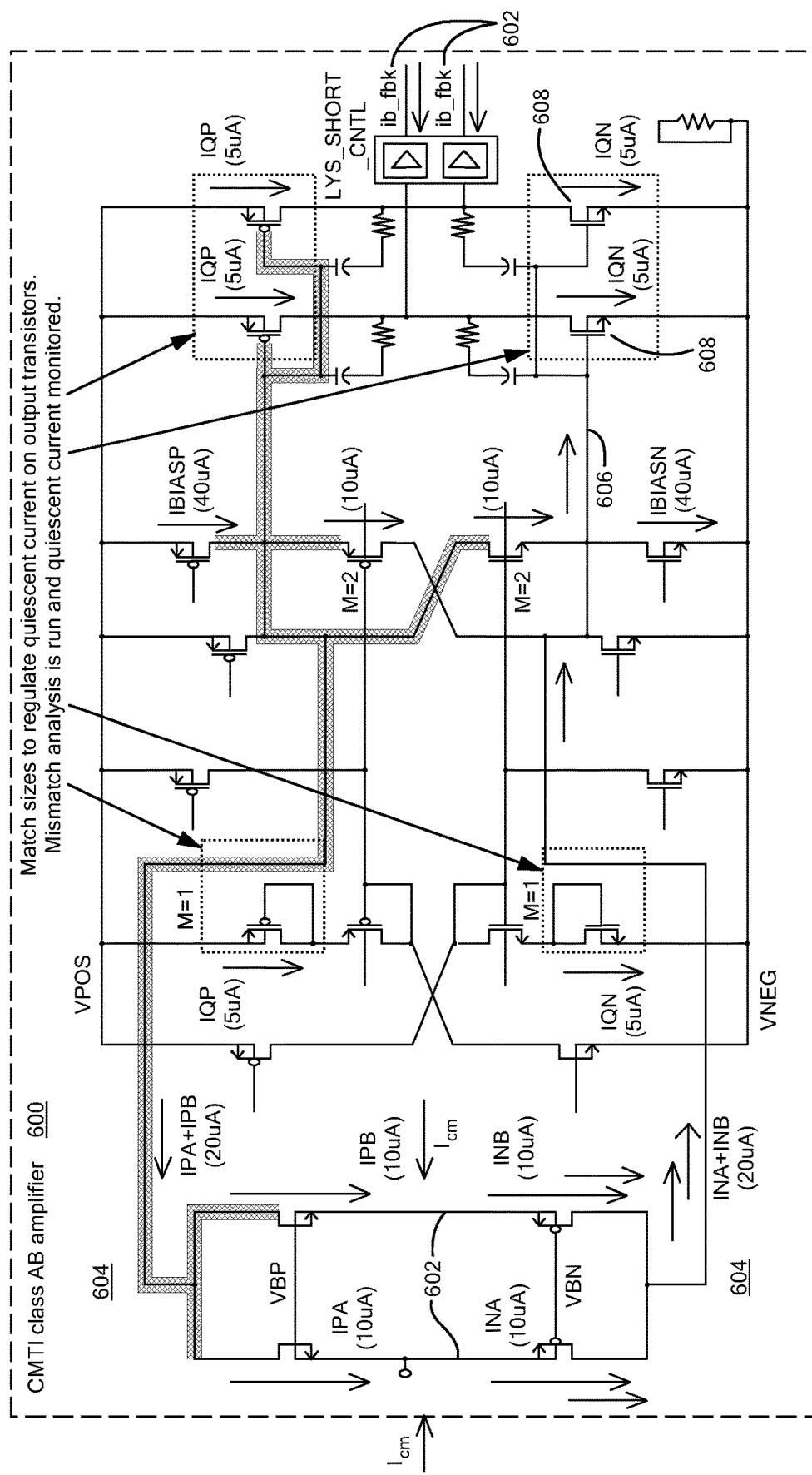
FIG. 6 is a circuit diagram of an example class AB common mode signal processing amplifier when a CMTI strike is present.

FIG. 6 shows example amplifier 600 operation when common mode current $I_{CM}$ is injected during a CMTI strike during which the input nodes 602 tend to increase voltage. The change in the common mode voltage is detected though the input pair of the CMTI suppressor increasing the absolute value of the sum of the currents 604 INA+INB+2$I_{CM}$. This current imbalance is injected to the class AB common-mode output stage in the node 606 that is charged up to compensate for the input common-mode current to be zero through the output N-MOS transistor 608.

Figure 7:
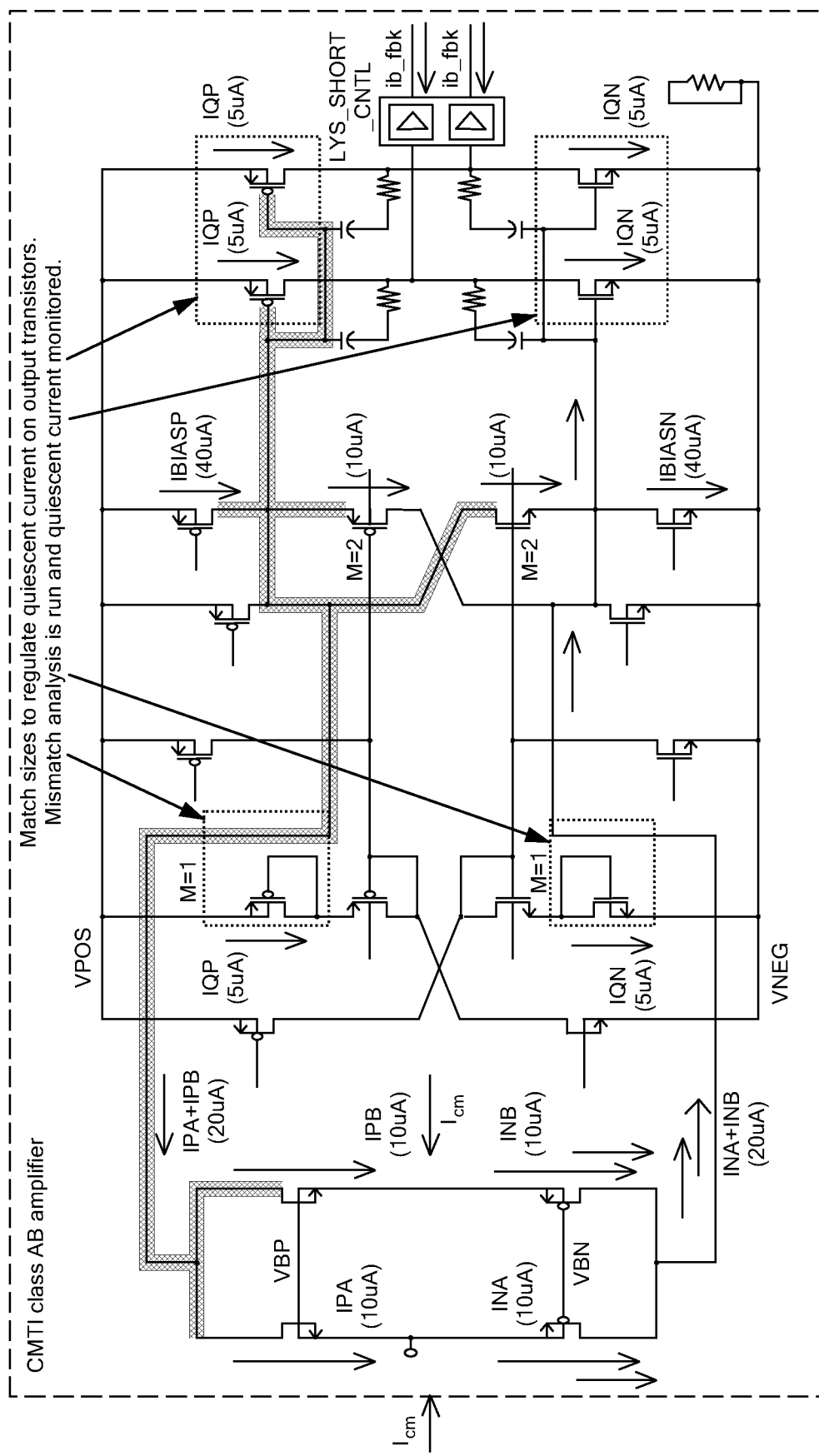
FIG. 7 circuit diagram of an example class AB common mode signal processing amplifier with indicators to show how signal bandwidth may be determined.

FIG. 7 shows an example amplifier 700 having an input impedance determined based on the input stage transconductances gm and output impedances ro of the amplifier output stage, as set forth below:

$$R_{in} \approx \frac{1}{gm_1 + gm_2} // (ro_5 // ro_6)$$

In embodiments, a bandwidth of the amplifier can be determined based on the transconductances, drain source current $I_{DS}$, a constant K, and a total capacitance $C_{TOT}$.

$$BW \approx \frac{1}{2 \cdot \pi \cdot \frac{1}{1/(gm\_pmos7 + gm\_nmos7)} \cdot C_{TOT}} = \frac{\sqrt{K \cdot I_{DS}}}{\pi \cdot C_{TOT}}$$

It is understood that the devices in the circled 7 in FIG. 7 are involved in the first order equation above for gm_nmos7 and gm_pmos7.

The total capacitance $C_{TOT}$ is determined from drain d, gate g, source s and body b capacitances of the transistors.

$C_{TOT}=2 \cdot C_{dg\_1}+2 \cdot C_{db\_1}+C_{dg\_4}+C_{db\_4}+2 \cdot C_{sg\_7}+ 2 \cdot C_{sb\_7}+2 \cdot C_{gs\_5}++2 \cdot (C_M+C_{gd5}) \cdot gm_5 \cdot R_{in}$ Active input impedance embodiments, such as those shown and described above, may provide advantages over passive input impedance configurations. When the input impedance is implemented using a solely passive network, the input dynamic range for differential and common mode are both related to the input impedance RIN_RX value. Given that both the signal for the differential mode and the signal for the common mode shares the same impedance path, the current input dynamic range is defined as the maximum total current before reaching the rails at the input of the receiver. This follows since passive configurations need to allocate the differential plus the common mode currents. In many applications, it is usual to find the common mode current being more than an order of magnitude when compared to the differential current, such as for specific CMTI requirements. In this scenario, and more particularly when the input dynamic range is limited to a couple of hundred of mV, passive configurations may not be adequate.

Example embodiments of active common-mode loops to suppress the common mode currents and define the input impedance may overcome limitations imposed by low voltage applications where the input dynamic range is a hundred of mV and where the input impedance maximum limiting value leaves the differential signal too small which compromises the overall gain of the signal path and the signal to noise ratio as well. In example embodiments, the input differential impedance is separated from the common mode impedance. By sensing the common mode current at the input of the receiver amplifier and subtracting it at the same input nodes, such as by using current mirrors, creates a variable common mode impedance that does not affect the differential impedance of the amplifier. This provides a degree of freedom on the calculations of the differential and common modes input impedances (due to dynamic range limitations) and in the same way maximizes the available dynamic range for the differential signal by virtually not consuming headroom or dynamic range in the common mode signal.

It is understood that processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or objectoriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer.

Processing may also be implemented as a machine-readable storage medium, configured with a computer program, where upon execution, instructions in the computer program cause the computer to operate.

Processing may be performed by one or more programmable embedded processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A signal isolator, comprising:
   a first die comprising a transmit module, wherein the first die has a first voltage domain; and
   a second die comprising a receive module including a receive amplifier configured to receive from the transmit module a transmit signal that includes a differential signal and a common mode current, wherein the second die has a second voltage domain, wherein the first and second die are separated by an isolation barrier, and wherein the receive amplifier comprises:
      a differential amplifier to receive the differential input signal from the transmit module; and
      a common mode module configured to sense the common mode current and sink or source the common mode current and minimize changes to an input impedance of the receive amplifier, wherein the common mode module comprises a class AB amplifier.

2. The signal isolator according to claim 1, wherein the first and second die have a capacitively coupled signal connection to carry the transmit signal.

3. The signal isolator according to claim 1, wherein the common mode module is configured to control a regulated input common mode voltage so that a dynamic range of the differential amplifier is used for the differential input signal.

4. The signal isolator according to claim 1, wherein the common mode module is configured to control a regulated input common mode voltage so that a dynamic range of the differential amplifier is not used for the common mode current.

5. The signal isolator according to claim 1, wherein receive module is configured to separate a differential impedance and a common mode impedance.

6. A method, comprising:
   employing, in a signal isolator, a first die comprising a transmit module, wherein the first die has a first voltage domain; and
   employing a second die comprising a receive module including a receive amplifier configured to receive from the transmit module a transmit signal that includes a differential signal and a common mode current, wherein the second die has a second voltage domain, wherein the first and second die are separated by an isolation barrier, and wherein the receive amplifier comprises:
      a differential amplifier to receive the differential input signal from the transmit module; and
      a common mode module configured to sense the common mode current and sink or source the common mode current and minimize changes to an input impedance of the receive amplifier, wherein the common mode module comprises a class AB amplifier.

7. The method according to claim 6, wherein the first and second die have a capacitively coupled signal connection to carry the transmit signal.

8. The method according to claim 6, wherein the common mode module is configured to control a regulated input common mode voltage so that a dynamic range of the differential amplifier is used for the differential input signal.

9. The method according to claim 6, wherein the common mode module is configured to control a regulated input common mode voltage so that a dynamic range of the differential amplifier is not used for the common mode current.

10. The method according to claim 6, wherein receive module is configured to separate a differential impedance and a common mode impedance.

11. A signal isolator, comprising:
    a first die means for providing a transmit module and a first voltage domain; and
    a second die means for providing a receive module including a receive amplifier configured to receive from the transmit module a transmit signal that includes a differential signal and a common mode current, wherein the second die has a second voltage domain, wherein the first and second die are separated by an isolation barrier, and wherein the receive amplifier comprises:
       a differential amplifier means for receiving the differential input signal from the transmit module; and
       a common mode means for sensing the common mode current and sink or source the common mode current and minimizing changes to an input impedance of the receive amplifier, wherein the common mode means comprises a class AB amplifier.

12. The signal isolator according to claim 11, wherein the first and second die means have a capacitively coupled signal connection to carry the transmit signal.

13. The signal isolator according to claim 11, wherein the common mode means is configured to control a regulated input common mode voltage so that a dynamic range of the differential amplifier is used for the differential input signal.

14. The signal isolator according to claim 11, wherein the common mode means is configured for controlling a regulated input common mode voltage so that a dynamic range of the differential amplifier is not used for the common mode current.

15. The signal isolator according to claim 11, wherein receive means is configured for separating a differential impedance and a common mode impedance.

* * * * *